United States Patent [19]

Andresen

[11] Patent Number: 5,004,936

[45] Date of Patent: Apr. 2, 1991

[54] NON-LOADING OUTPUT DRIVER CIRCUIT

[75] Inventor: Bernhard H. Andresen, Dallas, Tex.

[73] Assignee: Texas Instruments Incorporated, Dallas, Tex.

[21] Appl. No.: 332,261

[22] Filed: Mar. 31, 1989

[51] Int. Cl.$^5$ ................ H03K 19/003; H03K 19/094; H03K 17/16; H03K 17/687

[52] U.S. Cl. .................................... 307/443; 307/451; 307/475; 307/482.1; 307/585; 307/542

[58] Field of Search ............... 307/443, 542, 451, 585, 307/576, 579, 270, 475, 296.1, 296.8, 592, 594, 605

[56] References Cited

U.S. PATENT DOCUMENTS

| | | | |
|---|---|---|---|
| 4,628,218 | 12/1986 | Nakaizumi | 307/451 |
| 4,785,203 | 11/1988 | Nakamura | 307/451 X |
| 4,855,623 | 8/1989 | Flaherty | 307/451 X |
| 4,868,422 | 9/1989 | Daniele et al. | 307/443 X |
| 4,877,980 | 10/1989 | Kubinec | 307/443 X |
| 4,880,997 | 11/1989 | Steele | 307/451 X |
| 4,883,976 | 11/1989 | Deane | 307/443 X |
| 4,894,560 | 1/1990 | Chung | 307/443 X |

*Primary Examiner*—Stanley D. Miller
*Assistant Examiner*—David R. Bertelson
*Attorney, Agent, or Firm*—B. Peter Barndt; Melvin Sharp; James T. Comfort

[57] ABSTRACT

An output driver is provided for an IC (14, 16 and 18) to drive a data bus (12) connected thereto. The output driver may include a push-pull configuration comprising both a P and N channel transistor (78 and 80, respectively). A switching network of transistors (86, 88, 90, 92 and 94) is included to prevent loading of the output signal, $V_{out}$ when the power supply voltage, $V_{cc}$ is inactive. More particularly, the backgate of P channel transistor (78) is coupled to $V_{out}$ when $V_{cc}$ is inactive and coupled to $V_{cc}$ when $V_{cc}$ is active.

30 Claims, 2 Drawing Sheets

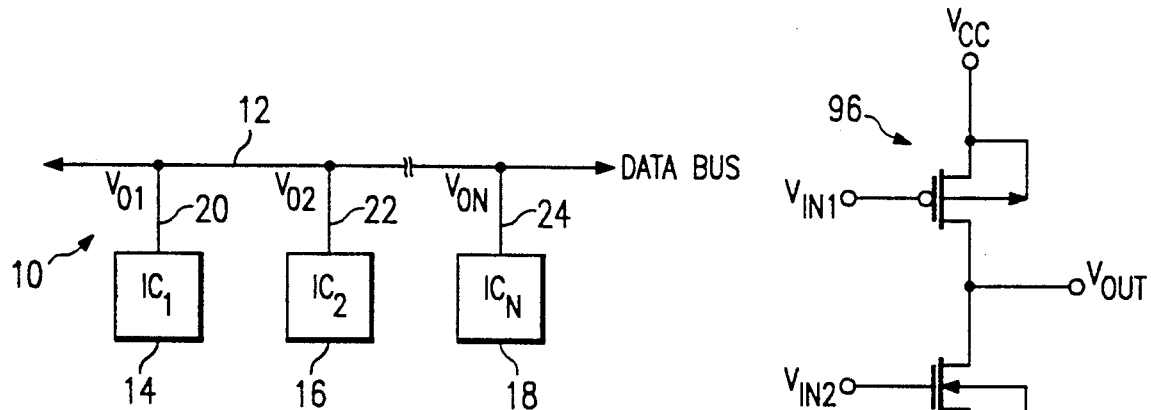
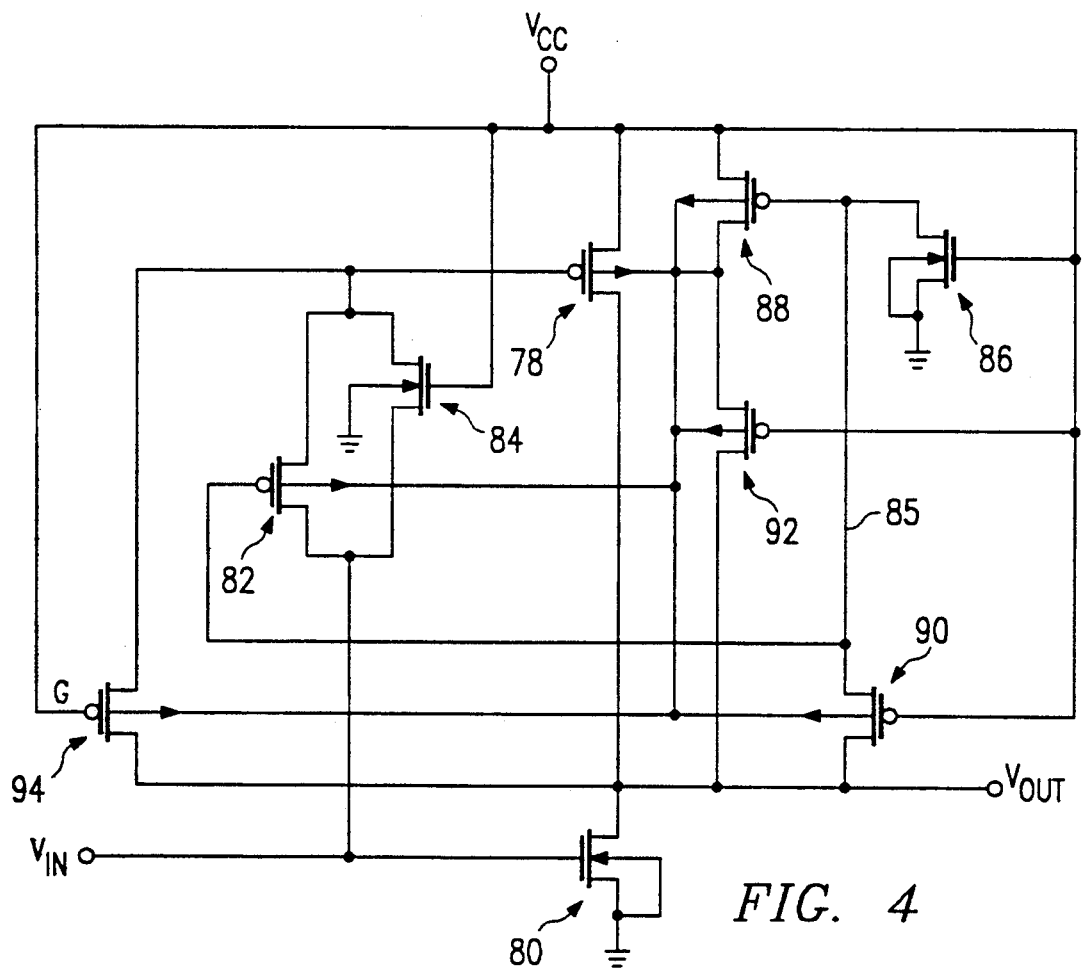

NON-LOADING OUTPUT DRIVER CIRCUIT

TECHNICAL FIELD OF THE INVENTION

This invention relates to output driver circuitry, and more particularly to an output driver circuit connected to an output data bus, wherein the output driver circuit will not load the output data bus which is active when the chip containing the output driver circuit is powered down.

BACKGROUND OF THE INVENTION

In digital signal processing, it is common to drive a single data bus with a plurality of independent integrated circuits ("ICs"). Each IC may provide an output signal to the data bus for further signal processing. However, it is often desirable to disable or power-down one or more of the ICs while others connected to the data bus remain active. The active ICs continue to provide output signals to the data bus. Accordingly, the disabled ICs must be constructed such that they do not load the output signals on the data bus provided by those ICs which still remain active. Typically, a driver circuit is included within the IC to serve this non-loading purpose.

Non-loading CMOS IC drivers available today typically use N channel transistors in an open drain configuration to drive the output signal. The use of an N channel transistor requires an additional pullup resistor external to the IC associated with the transistor and its supply voltage signal $V_{cc}$. The pullup resistor combined with capacitance along the data bus can give rise to power consumption and delay time in output signal transitions. The power consumption arises from current through the pullup resistor when the transistor output is a logic "0". The delay arises from the slow logic "0" to logic "1" transition and is determined by the R-C time constant associated with the pullup resistor and circuit capacitance. The resistance value may be lessened in order to decrease delay times associated therewith, but this will correspondingly increase power consumption. Alternatively, the resistance may be increased to minimize power consumption, but this will increase delay times associated with the output signal.

Therefore, a need has arisen for an output driver circuit which may be utilized with an IC driving a data bus, wherein the data bus may remain active while the IC is powered down. Further, this output driver should minimize power consumption and delay problems associated with the prior art.

SUMMARY OF THE INVENTION

In accordance with the present invention, a configuration and operation of an output driver circuit is provided which substantially eliminates or reduces disadvantages and problems associated with prior output driver configurations.

A non-loading output driver circuit in accordance with the present invention will supply an output signal to a data bus. The output driver circuit is configured not to load the data bus at times when the driver is inactive while the data bus remains active. This non-loading output driver circuit includes a supply voltage signal which renders the output driver circuit active. The invention also comprises output signal circuitry including a semiconductor region generally of a first conductivity type coupled to the data bus. A second semiconductor region comprising a second conductivity type is adjacent the first semiconductor region and is also electrically connected to a reference voltage level. Switching circuitry is provided with the output signal circuitry for alternatively connecting the reference voltage level between the supply voltage signal and the output signal of the output driver circuit. More particularly, the reference voltage level is connected to the supply voltage signal when the supply voltage signal is active, and alternatively, to the output signal when the supply voltage signal is inactive.

The present invention provides the technical advantages of minimizing power dissipation and delay times associated with the output driver circuit. Another important technical advantage of the present invention includes the ability to use the output driver circuit with an active data bus when the output driver circuit itself is no longer active. The present invention minimizes loading of the output signal along the data bus at times when the output driver circuit is inactive.

BRIEF DESCRIPTION OF THE DRAWINGS

For a more complete understanding of the present invention and the advantages thereof, reference is now made to the following descriptions taken in conjunction with the accompanying drawings, in which;

FIG. 1 illustrates a typical data bus having a plurality of integrated circuits attached thereto;

FIGS. 2b-c illustrate the transfer characteristics of the configuration shown in FIG. 2a;

FIG. 3b illustrates the transfer characteristics of the output driver shown in FIG. 3a;

FIG. 3c illustrates a cross-sectional view of the semiconductor components of the output driver shown in FIG. 3a;

FIG. 4 illustrates the preferred embodiment of the push-pull output driver circuit of the present invention; and FIG. 5 illustrates a three-state output driver operable with the present invention.

DETAILED DESCRIPTION OF THE INVENTION

The preferred embodiment of the present invention is best understood by referring to FIGS. 1-5 of the drawings, like numerals being used for like and corresponding parts of the various drawings.

FIG. 1 illustrates a typical circuit configuration layout 10 giving rise to the need for the present invention. A data bus 12 is electrically connected to a plurality of integrated circuits ("ICs") 14, 16 and 18. ICs 14, 16 and 18 each produce an independent digital output voltage signal at output terminals 20, 22 and 24, respectively. These output signals are generated by output driving circuits (not shown) within each IC. Only one output driving circuit is active at a time thereby preventing contention for data bus 12. While one output driving circuit is active, the others are in a high impedance state. The output signals are transmitted along data bus 12 to other devices connected thereto.

A primary problem giving rise to the present invention occurs where it is desirable to deactivate at least one of the ICs along data bus 12 while permitting the other ICs to remain active. For example, in FIG. 1, if IC 14 were turned off while the remainder of ICs 16 and 18 were permitted to remain active, data bus 12 would further remain active due to the output voltage signals provided by those ICs still remaining active. If either IC 16 or IC 18 were to output a signal onto data bus 12, this signal would appear at output terminal 20 of IC 14. It is thus desirable to construct IC 14 such that it will not disturb (i.e. load) this output signal. It is therefore an object of the present invention to create an output driving circuit for a deactivated IC such that the deactivated IC will not load the other output signals along the data bus to which the ICs are attached.

Figure 2A:
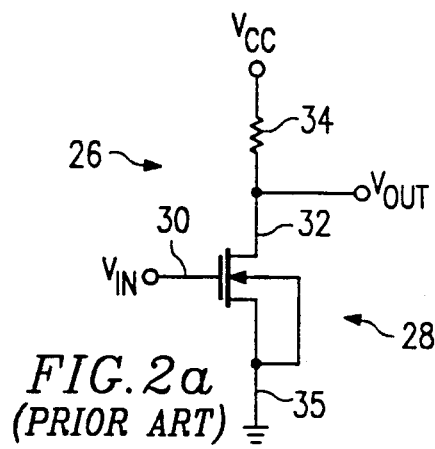
FIG. 2a illustrates a prior art output driving circuit configuration.

FIG. 2a illustrates a prior art output circuit configuration 26 used to prevent loading of the circuit as described in connection with FIG. 1. In FIG. 2a, an N channel transistor 28 drives an output signal $V_{out}$ in accordance with an input signal $V_{in}$. The input signal $V_{in}$ is electrically tied to the gate 30 of N channel transistor 28. The output is provided by the drain 32 of N channel transistor 28. Drain 32 is further connected to a resistor 34 which is external to the IC containing N channel transistor 28. Resistor 34 is connected to the power supply $V_{cc}$ used with circuit configuration 26. The source 35 is connected to ground.

Figure 2B:
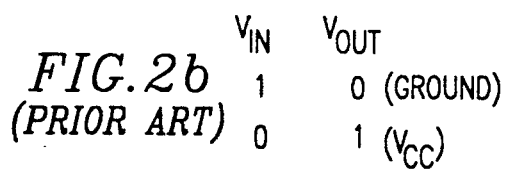
Figure 2C:
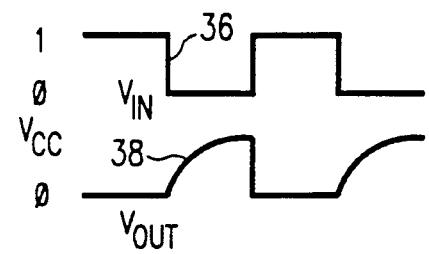

FIGS. 2b-c illustrate the response characteristics of the prior art output circuit configuration 26 illustrated in FIG. 2a. A high signal (i.e. a logic "1") provided at the circuit input will give rise to a low signal (i.e. logic "0") at the output. This occurs because the high signal at gate 30 causes N channel transistor 28 to conduct thereby grounding $V_{out}$. Alternatively, a logic "0" at the circuit input will cause N channel transistor 28 to go into a high impedance state, thereby forcing $V_{out}$ to the voltage level provided by $V_{cc}$ through resistor 34.

FIG. 2c illustrates the timing problems created by the response characteristics of circuit configuration 26 of FIG. 2a. Again, a "1" at the input signal gives rise to a "0" at the output signal. However, from FIG. 2c, it may be seen that an input transition from a "1" to a "0" 36 gives rise to a delay 38 before the output signal reaches its ultimate high magnitude. This delay can be attributed to the value of resistor 34 in combination with the capacitance along data bus 12 (see FIG. 1). The value of resistor 34 may be minimized to consequently minimize delay times associated therewith; however, this increases the current passing through resistor 34 thereby causing more power consumption. Thus, there exists a trade-off between delay time and power consumption associated with resistor 34. It is therefore an object of the present invention to provide an output driving circuit with substantially less delay time and minimal power consumption. Further, this output driving circuit should act to prevent loading of output signals along data bus 12 at periods when the IC associated with the output circuit is deactivated (i.e. powered-down).

Figure 3B:
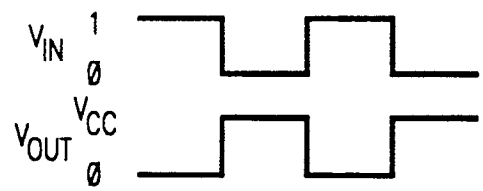
Figure 3A:
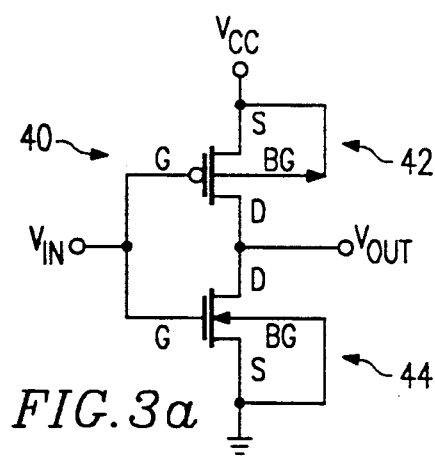
FIG. 3a illustrates the push-pull output driver of the present invention.

FIG. 3a illustrates a push-pull output driver 40. An uppermost supply voltage signal $V_{cc}$ is connected to the source (denoted "S") of P channel transistor 42. The lowermost supply voltage signal (here, ground) is similarly connected to the source of N channel transistor 44. The lowermost supply voltage signal may be a negative voltage as is common to applications exemplary of the art associated herewith. The gates (denoted "G") of both P channel transistor 42 and N channel transistor 44 are electrically tied to receive the input signal $V_{in}$. Similarly, the drains of P channel transistor 42 and N channel transistor 44 are electrically tied to provide the output signal $V_{out}$ of output driver 40. It is to be understood that the N and P channel transistors used herewith may be symmetrical, that is, such that either non-gate terminal may be used as either the source or drain thereof. For purposes of clarity, the term "source" herein refers to the supply voltage terminals of the P and N channel transistors. Conversely, the term "drain" refers to the output signal terminals of the P and N channel transistors. The backgate (denoted "BG") of P channel transistor 42 is connected to $V_{cc}$ while the backgate of N channel transistor 44 is connected to ground.

FIG. 3b illustrates the transfer characteristics of output driver 40 shown in FIG. 3a. A "1" provided at the input will cause N channel transistor 44 to conduct thereby creating a "0" at the output. Further, this "1" will cause P channel transistor 42 to be in a high impedance state with no effect on the output signal. Conversely, a "0" at the input will cause P channel transistor 42 to conduct, thereby giving rise to a "1" at the output while N channel transistor 44 is in a high impedance state with no effect on the output. Thus, the push-pull output driver 40 of the present invention creates a similar output characteristic as that associated with the prior art (see FIG. 2b), but substantially eliminates the power consumption and delay times associated therewith. No pullup resistor is necessary for the operation of output driver 40.

Figure 3D:
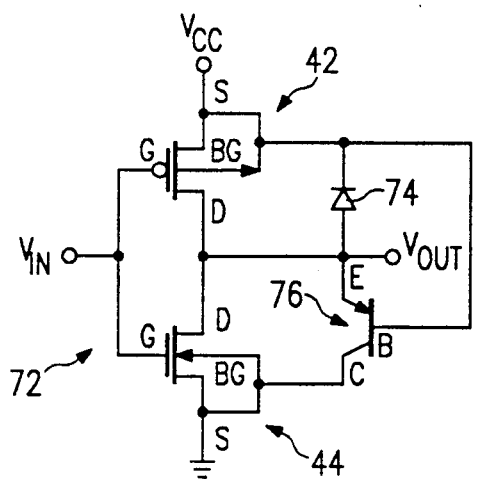
FIG. 3d illustrates the push-pull output driver of the present invention along with associated diode and transistor effects.
Figure 3C:
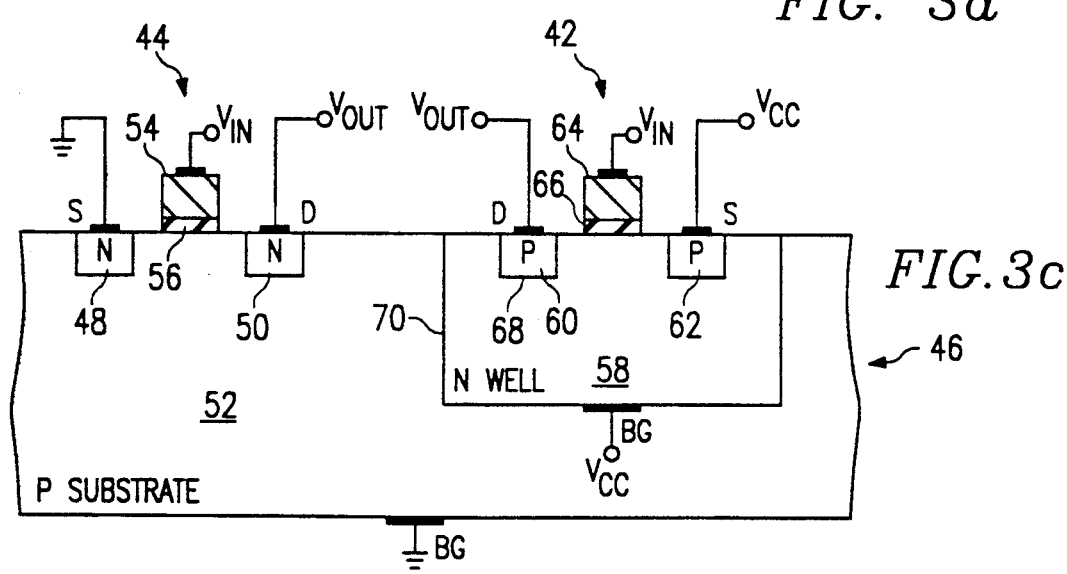

FIG. 3c illustrates a cross-sectional view of a semiconductor layout 46 of the output driver 40 illustrated in FIG. 3a. N channel transistor 44 is constructed by forming first and second N type regions 48 and 50 within a P type semiconductor substrate 52. Regions 48 and 50 comprise the source/drain regions of N channel transistor 44. The gate 54 of N channel transistor 44, along with a gate insulator 56, is formed over P substrate 52. As illustrated in FIG. 3a, the source of N channel transistor 44 is connected to ground while the drain provides the output signal $V_{out}$. Further, gate conductor 54 is connected to the input signal $V_{in}$ while the backgate is also connected to ground.

P channel transistor 42 is constructed by forming a well 58 of an N type semiconductor material within P type substrate 52. First and second P type regions 60 and 62 are formed within N well 58 as the source/drain regions of P channel transistor 42. A gate conductor 64 and gate insulator 66 are formed above N well 58. Gate conductor 64 is connected to $V_{in}$, while the drain of P channel transistor 42 provides the output signal $V_{out}$. The source and the backgate of P channel transistor 42 are electrically connected to the supply voltage signal $V_{cc}$.

While the construction depicted in FIGS. 3a and 3c forms a push-pull output driver 40 which provides significant advantages of operation, it has been found that this construction requires modification in order to provide high impedance at the output terminal in the powered down mode. It is an object of the present invention to provide a circuit driver which will not affect the output voltage signal $V_{out}$ along the data bus once the supply voltage $V_{cc}$ to the driver is no longer active. Thus, it is imperative to consider the effect of having a positive output signal applied at the circuit output when that circuit simultaneously has zero power supply voltage applied thereto.

As illustrated in FIG. 3c, the formation of a source/drain of P channel transistor 42 gives rise to PN junction 68 between P region 60 and N well 58. Thus, a diode effect can occur between the source/drain and backgate of P channel transistor 42. Accordingly, the source/drain acts as the diode anode while the backgate acts as the cathode. Further, a second PN junction 70 is created between P type substrate 52 and N well 58. Thus, a PNP transistor effect can occur due to the construction of the adjacent source/drain, N well, and P type substrate 52 shown in FIG. 3c. More particularly, the source/drain represents an emitter of this transistor, the N well 58 represents the base and the P substrate 52 represents the collector of this transistor.

FIG. 3d illustrates a schematic view 72 of the output driver circuit 40 of FIG. 3a with additional representations of the diode and transistor effects created by the semiconductor fabrication thereof. Again, a P channel transistor 42 and N channel transistor 44 are electrically connected as illustrated in FIG. 3a. However, a diode 74 occurs between the output signal $V_{out}$ and the backgate of P channel transistor 42. Further, a PNP transistor 76 occurs having its emitter (denoted "E") tied to the output signal $V_{out}$ its base (denoted "B") tied to the backgate of P channel transistor 42 and its collector (denoted "C") tied to the backgate of N channel transistor 44.

An important aspect of the present invention may be readily appreciated in light of FIG. 3d when considering the instance where the power supply $V_{cc}$ goes to "0" while the output voltage signal remains active. This situation will occur where data bus 12 (see FIG. 1) remains active while an IC coupled thereto is inactive. If $V_{cc}$ equals "0" while $V_{out}$ is driven high by another IC coupled to data bus 12, this may forward bias diode 74 causing a load on $V_{out}$ and current will flow from the output signal toward the backgate of P channel transistor 42. Further, this current may either clamp bus 12 to logic "0" or cause the disabled power supply signal $V_{cc}$ to increase thereby turning the powered down IC back on. Thus, diode 74 will cause loading of the output signal or improper activation of an IC presumed to be turned off.

If the backgate of N well 58 is disconnected from $V_{cc}$ current flow through diode 74 as described above is avoided. However, this still leaves two current paths to load data bus 12. First, $V_{in}$ of P channel transistor 42 will approximate 0 volts when $V_{cc}$ is 0 volts. However, when $V_{out}$ goes to a logic "1", current will flow from $V_{out}$ to $V_{cc}$ because transistor 42 is turned on. Second, adverse effects of PNP transistor 76 will occur in the instance where $V_{cc}$ equals "0" and $V_{out}$ is positive. PN junction 68 will cause N well 58 to be biased at one diode drop below $V_{out}$. There will be reverse biased diode leakage current between N well 58 and substrate 52 which is base current for parasitic PNP transistor 76. Further, a current in the magnitude of the transistor beta times the base current will leak through the transistor collector to the backgate of N channel transistor 44. Thus, again it may be seen that in the instance where $V_{out}$ exceeds $V_{cc}$ leakage effects will cause a load on the $V_{out}$ signal. The present invention includes a switching network whereby the leakage effects associated with diode 74 and transistor 76 may be substantially eliminated.

The present invention recognizes that if the backgate of P channel transistor 42 were tied to the uppermost available voltage signal during times when $V_{cc}$ is inactive, then forward biasing of diode 74 and the emitter/base of transistor 76 could not occur. If forward biasing of diode 74 and PNP transistor 76 cannot occur, then loading of the output signal will be eliminated. Because the supply voltage is inactive, $V_{out}$ will be the highest available voltage level. Therefore, $V_{out}$ should be connected to the backgate of P channel transistor 42 when $V_{cc}$ is inactive. Accordingly, with respect to diode 74, there would be equal voltages at both its cathode and anode; therefore, diode 74 could not conduct. With respect to transistor 76, there would be equal voltages at both its base and emitter and therefore, transistor 76 would also fail to conduct. Thus, it is an object of the present invention to construct a switching network such that this premise can be readily effected.

It is to be understood that the materials and levels of dopants associated with the devices illustrated in FIG. 3c may vary. The present invention operates, in part, to deal with the diode and transistor effects described above. These same effects may occur whenever there are regions and junctions similar to those described which give rise to loading problems when those regions are electrically biased in a given direction. Thus, Applicant fully intends to include within the invention the use of other materials which cause leakage problems when forward biased by the output signal in the configuration hereinabove described.

FIG. 4 illustrates the preferred embodiment of the present invention which incorporates circuitry to compensate for the diode and transistor effects previously noted. The circuit depicted in FIG. 4 may be readily constructed with CMOS transistors. The combination of P channel transistor 78 and N channel transistor 80 form the push-pull output driver as described in connection with FIG. 3a. However, rather than tieing the backgate of P channel transistor 78 permanently to $V_{cc}$ a switching network is provided to alternatively switch that backgate between $V_{cc}$ and $V_{out}$. Once again, the drains of P channel transistor 78 and N channel transistor 80 are connected and comprise the output signal $V_{out}$. The source of transistor 78 is connected to $V_{cc}$ while the source of transistor 80 is connected to ground.

The combination of P channel transistor 82 and N channel transistor 84 combine to form a "transmission gate" between the input signal $V_{in}$ and the gate of P channel transistor 78. More particularly, the input signal $V_{in}$ is connected to a source/drain of both P channel transistor 82 and N channel transistor 84. The other source/drain of transistors 82 and 84 is connected to the gate of P channel transistor 78. The gate of N channel transistor 84 is connected to $V_{cc}$. The gate of P channel transistor 82 is connected to node 85.

The gate of N channel transistor 86 is connected to $V_{cc}$ its source connected to ground and its drain connected to the gate of P channel transistor 88. The gate of P channel transistor 88 is connected to node 85 and the drain thereof is connected to the backgate of P channel transistor 78. The source of P channel transistor 88 is connected to $V_{cc}$. P channel transistor 90 has its source connected to $V_{out}$ its gate connected to $V_{cc}$ and its drain to node 85 and consequently to the gate of P channel transistor 88. P channel transistor 92 has its gate connected to $V_{cc}$ its source connected to $V_{out}$ and its drain connected to the backgate of P channel transistor 78. P channel transistor 94 has its source connected to $V_{out}$ its gate connected to $V_{cc}$ and its drain connected to the gate of P channel transistor 78.

The backgates of N channel transistors 80, 84 and 86 are all tied to ground. The backgates of P channel transistors 82, 88, 90, 92 and 94 are all tied to the backgate of P channel transistor 78.

The configuration illustrated in FIG. 4 operates to fully drive the output signal when $V_{cc}$ is active while further insuring that no load will occur to $V_{out}$ once $V_{cc}$ is powered-down. Thus, the present invention may be readily appreciated when examined under two instances; namely, when $V_{cc}$ is active and when $V_{cc}$ is inactive (i.e. powered-down).

When $V_{cc}$ is active, N channel transistor 86 will conduct, thereby grounding the gate of P channel transistor 88. P channel transistor will conduct to electrically connect the backgate of P channel transistor to $V_{cc}$. Thus, when $V_{cc}$ is in its active state, the backgate of P channel transistor 78 of the push-pull driver is connected to $V_{cc}$ as illustrated in FIG. 3a. Accordingly, the output characteristics shown in FIG. 3b may be realized when $V_{cc}$ is active.

When $V_{cc}$ is inactive, P channel transistor 92 will conduct, thereby electrically coupling the backgate of P channel transistor 78 to $V_{out}$ as mentioned in connection with FIG. 3d. This prevents both diode 74 and PNP transistor 76 (see FIG. 3d) from conducting and causing leakage and loading during time periods when $V_{cc}$ is powered-down. Further, because the backgates of all of the P channel transistors are connected to the uppermost available voltage, there is no leakage path for each of these transistors. For each P channel transistor, there is a similar diode effect as discussed in connection with FIG. 3d. Because the backgate of each transistor is kept at the uppermost available voltage, the diodes within each transistor are kept from forward biasing.

P channel transistors 90 and 92 operate to fully assure that P channel transistor 88 will not conduct once $V_{cc}$ is powered-down. When $V_{cc}$ is powered-down, P channel transistor 90 will conduct thereby placing the $V_{out}$ signal at the gate of P channel transistor 88. Further, when $V_{cc}$ is inactive, P channel transistor 92 places the $V_{out}$ signal at the backgate of P channel transistor 88. Therefore, the most positive voltage exists at both the gate and backgate of P channel transistor 88 and thus, it cannot conduct. Similarly, P channel transistor 94 prevents P channel transistor 78 from conducting once $V_{cc}$ is powered-down. When $V_{cc}$ is powered-down, P channel transistor 94 conducts the $V_{out}$ signal to the gate of P channel transistor 78. Because the most positive voltage is applied to both gate and backgate of P channel transistor 78, it cannot conduct.

The operation of the transmission gate formed by transistors 82 and 84 is as follows. When $V_{cc}$ is active, N channel transistor is on by having its gate directly coupled to $V_{cc}$. The gate of P channel transistor 82 is grounded by N channel transistor 86, and therefore P channel transistor 82 is also on. Thus, when $V_{cc}$ is active, the transmission gate conducts the input signal to the gate of P channel transistor 78. When $V_{cc}$ is inactive, the gate of N channel transistor 84 is at the lowest available voltage, and therefore N channel transistor 84 cannot conduct. The gate of P channel transistor 82 is connected to $V_{out}$ (via P channel transistor 90), as is one source/drain of P channel transistor 82 (via P channel transistor 94). Therefore, P channel transistor 82 cannot conduct because there is no negative voltage difference between its gate and that source/drain. This guarantees that a low potential at $V_{in}$ cannot cause a leakage when P channel transistor 94 switches the gate of P channel transistor 78 to $V_{out}$.

It should be further noted that the present invention will include other output driving configurations wherein there exists a diode effect between the output signal and the backgate of the output device. For example, the three-state output driver 96 shown in FIG. 5 has a similar configuration and semiconductor fabrication of the push-pull driver 40 shown in FIGS. 3a and 3c. The only schematic and semiconductor construction difference between the two configurations is that the three-state driver uses two independent input signals as opposed to a combined signal as in the case of the push-pull circuit. The Applicant fully intends to include this and other similar instances within the scope of his described and claimed invention.

Although the preferred embodiment of the invention has been described in detail, it should be understood that various changes, substitutions and alterations can be made therein without departing from the spirit and scope of the invention as defined by the appended claims.

What is claimed is:

1. A non-loading output driver circuit for supplying an output signal to a data bus, wherein the data bus may be active when the output driver circuit is inactive, comprising:
   output signal circuitry including:
   a first semiconductor region of a first conductivity type electrically coupled to an output terminal for supplying the output signal to the data bus; and
   a second semiconductor region of a second conductivity type adjacent said first semiconductor region and coupled to a reference voltage level, wherein forward biasing said first semiconductor region with respect to said second semiconductor region creates a conduction path between said first and second semiconductor regions; and
   switching circuitry for alternatively connecting said reference voltage level between a supply voltage signal and the output signal.

2. The output driver circuit of claim 1 wherein said output signal circuitry includes:
   a P channel transistor; and
   an N channel transistor, each of said P and said N channel transistors having a gate, a first source/drain, a second source/drain and a backgate associated therewith.

3. The output driver circuit of claim 2 wherein said first source/drains of said P and said N channel transistors are electrically coupled for providing the output signal.

4. The output driver circuit of claim 2 wherein said gates of said P and said N channel transistors are electrically coupled to receive an input signal of the output driver circuit.

5. The output driver circuit of claim 4 and further including a transmission gate electrically coupled between said input signal and said gate of said P channel transistor.

6. The output driver circuit of claim 2 and further including circuitry for connecting said gate and one of said source/drains of said P channel transistor to the output signal when said supply voltage signal is inactive.

7. The output driver circuit of claim 1 wherein said switching circuitry comprises a switching network which electrically connects said reference voltage to said supply voltage signal when said supply voltage signal is active.

8. The output driver circuit of claim 1 wherein said switching circuitry comprises a switching network which electrically connects said reference voltage to the output signal when said supply voltage signal is inactive.

9. The output driver circuit of claim 1 and further including a third semiconductor region of a first conductivity type adjacent said second semiconductor region of a second conductivity type.

10. A non-loading output driver circuit responsive to a supply voltage signal for supplying an output signal to a data bus, wherein the data bus may be active when the output driver circuit is inactive, comprising:
   a first P channel transistor having a first and second source/drain, a gate and a backgate;
   a first N channel transistor having a first and second source/drain, a gate and a backgate, said first source/drains of said P and N channel transistors electrically coupled to an output terminal for providing the output signal; and
   switching circuitry for selectively coupling the backgate of said first P channel transistor to the supply voltage signal when the supply voltage signal is active and to the output signal when the supply voltage signal is inactive.

11. The output driver circuit of claim 10 wherein said gates of said first P and N channel transistors are electrically connected for receiving an input signal.

12. The output driver circuit of claim 10 wherein said switching circuitry comprises:
   a second N channel transistor having a gate coupled to the supply voltage signal and a first source/drain connected to ground; and
   a second P channel transistor having a gate tied to a second source/drain of said second N channel transistor, a first source/drain connected to said gate of said first P channel transistor, and a second source/drain connected to the supply voltage signal.

13. The output driver circuit of claim 10 wherein said switching circuitry comprises a second P channel transistor having a first source/drain connected to the backgate of said first P channel transistor, a gate coupled to the supply voltage signal and a second source/drain coupled to the output signal.

14. The output driver circuit of claim 10 and further including a transmission gate coupled between an input signal and said gate of said first P channel transistor.

15. The output driver circuit of claim 10 and further including circuitry connecting said gate and said first source/drain of said first P channel transistor to the output signal when the supply voltage signal is inactive.

16. A method of providing an output signal from a driving circuit to a data bus when the driving circuit is active, while providing no load to the data bus when the driving circuit is inactive, comprising the steps of:
   connecting a supply voltage signal to the driving circuit;
   connecting an input signal to the driving circuit;
   connecting a first semiconductor region of a first conductivity type within the driving circuit to the output signal; and
   connecting a second semiconductor region of a second conductivity type within the driving circuit to a reference voltage level, wherein forward biasing the first semiconductor region with respect to the second semiconductor region creates a conductive path between said first and second semiconductor regions; and
   alternatively connecting the reference voltage level between the supply voltage signal and the output signal.

17. The method of claim 16 wherein said step of alternatively connecting the reference voltage level comprises:
   connecting the reference voltage level to the supply voltage signal when the supply voltage signal is active; and
   connecting the reference voltage level to the output signal when the supply voltage signal is inactive.

18. The method of claim 16 wherein said step of alternatively connecting the reference voltage level comprises connecting the reference voltage level to the supply voltage signal through a P channel transistor in response to a predetermined signal at a gate of an N channel transistor.

19. The method of claim 16 wherein said step of alternatively connecting the reference voltage level comprises connecting the reference voltage level through a P channel transistor to the output signal in response to a predetermined signal at a gate of the P channel transistor.

20. The method of claim 16 wherein said step of connecting an input signal to the driving circuit comprises:
   connecting the input signal to a gate of a P channel transistor; and
   connecting the input signal to a gate of an N channel transistor.

21. The method of claim 20 wherein said step of connecting an input signal to the gate of a P channel transistor comprises:
   connecting the input signal to an input of a transmission gate; and
   connecting an output of the transmission gate to the gate of the P channel transistor.

22. A method of forming a non-loading output driver circuit responsive to a supply voltage signal for supplying an output signal to a data bus, wherein the data bus may be active when the output driver circuit is inactive, comprising the steps of:
   forming output signal circuitry including:
      forming a first semiconductor region of a first conductivity type coupled to the data bus; and
      forming a second semiconductor region of a second conductivity type adjacent the first semiconductor region, the second semiconductor region coupled to a reference voltage level, wherein forward biasing the first semiconductor region with respect to the second semiconductor region enables current through the regions; and
   forming switching circuitry associated with the output signal circuitry for alternatively connecting the reference voltage level between the supply voltage signal and the output signal.

23. The method of claim 22 wherein said step of forming the output signal circuitry includes:
   forming a first P channel transistor; and
   forming a first N channel transistor, each of the first P and N channel transistors having a gate, a first and second source/drain and a backgate associated therewith.

24. The method of claim 23 and further including the step of electrically coupling one of the source/drains of each of the first P and N channel transistors for providing the output signal.

25. The method of claim 23 and further including the step of electrically coupling the gates of each of the first P and N channel transistors for receiving an input signal.

26. The method of claim 23 and further including the step of electrically coupling a transmission gate to the gate of the first P channel transistor for receiving an input signal.

27. The method of claim 23 wherein said step of forming the switching circuitry further includes:
   forming a second N channel transistor having a gate connected to the supply voltage signal and a first source/drain connected to ground; and
   forming a second P channel transistor having a gate tied to a second source/drain of the second N channel transistor, a first source/drain connected to the supply voltage level and a second source/drain connected to the backgate of the first P channel transistor.

28. The method of claim 23 wherein said step of forming the switching circuitry further includes forming a second P channel transistor having a gate connected to the supply voltage signal, a first source/drain connected to the output signal and a second source/drain connected to the backgate of the first P channel transistor.

29. The method of claim 22 wherein said step of forming the non-loading output driver circuit further includes forming a third semiconductor region of a first conductivity type adjacent the second semiconductor region

30. A non-loading output driver circuit formed by the method of claim 22.

* * * * *